United States Patent
Kim et al.

(10) Patent No.: US 10,201,079 B2
(45) Date of Patent: Feb. 5, 2019

(54) FLEXIBLE ELECTRONIC DEVICE AND METHOD OF MANUFACTURING THE SAME

(71) Applicant: Samsung Display Co., Ltd., Yongin-si (KR)

(72) Inventors: Jaeneung Kim, Seoul (KR); Jungha Son, Seoul (KR); Yong-hwan Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/465,545

(22) Filed: Mar. 21, 2017

(65) Prior Publication Data

US 2017/0280553 A1    Sep. 28, 2017

(30) Foreign Application Priority Data

Mar. 22, 2016    (KR) .................. 10-2016-0034153

(51) Int. Cl.
*H01L 51/00* (2006.01)
*H05K 1/02* (2006.01)
(Continued)

(52) U.S. Cl.
CPC ........... *H05K 1/028* (2013.01); *H01L 27/323* (2013.01); *H01L 51/0097* (2013.01);
(Continued)

(58) Field of Classification Search
CPC ..... A61B 5/00; A61B 5/6897; A61B 5/02108; A61B 5/0215; A61B 5/1036; A61B 5/021; A61B 5/6801; A61B 2562/028; A61B 2562/0247; H01L 27/323; H01L 27/3276; H01L 27/3288; H01L 51/00; H01L 51/0097; H01L 2251/5338; H05K 1/028; H05K 1/0313; H05K 3/00; H05K 3/0017; H05K 3/02; H05K 1/02; H05K 1/03; G06F 3/0416; G06F 3/044; G06F 3/047;
(Continued)

(56) References Cited

U.S. PATENT DOCUMENTS 7,642,157 B2    1/2010   Yates et al.
9,699,906 B2 *  7/2017   Rathburn ............. H05K 1/0216
(Continued)

FOREIGN PATENT DOCUMENTS

JP      5111024       3/2009
KR    10-0701543       3/2007
(Continued)

*Primary Examiner* — Timothy Thompson
*Assistant Examiner* — Guillermo Egoavil
(74) *Attorney, Agent, or Firm* — H.C. Park & Associates, PLC

(57) ABSTRACT

A flexible electronic device including a substrate and a line layer disposed on the substrate. The line layer includes a first conductive layer disposed on the substrate, a plurality of polymer walls disposed on the first conductive layer and spaced apart from each other in a horizontal direction parallel to the substrate, and a second conductive layer including first portions disposed between the polymer walls and a second portion disposed on the polymer walls. A portion of the first conductive layer contacts the first portions.

18 Claims, 11 Drawing Sheets

(51) Int. Cl.
  *H05K 1/03* (2006.01)
  *H05K 3/00* (2006.01)
  *H05K 3/02* (2006.01)
  *H01L 27/32* (2006.01)
  *G06F 3/041* (2006.01)
  *G06F 3/044* (2006.01)
  *G06F 3/047* (2006.01)

(52) U.S. Cl.
  CPC ......... *H05K 1/0313* (2013.01); *H05K 3/0017* (2013.01); *H05K 3/02* (2013.01); *G06F 3/044* (2013.01); *G06F 3/047* (2013.01); *G06F 3/0416* (2013.01); *G06F 2203/04102* (2013.01); *G06F 2203/04103* (2013.01); *G06F 2203/04111* (2013.01); *G06F 2203/04112* (2013.01); *H01L 2251/5338* (2013.01)

(58) Field of Classification Search
  CPC . G06F 2203/04102; G06F 2203/04103; G06F 2203/04111; G06F 2203/04112
  USPC .......................................... 174/254; 600/485
  See application file for complete search history.

(56) References Cited

U.S. PATENT DOCUMENTS

2009/0061255 A1    3/2009  Sone et al.
2016/0287089 A1*   10/2016 Yi ........................ A61B 5/6897

FOREIGN PATENT DOCUMENTS

KR    10-1571253    11/2015
KR    10-1626214     5/2016

* cited by examiner

FLEXIBLE ELECTRONIC DEVICE AND METHOD OF MANUFACTURING THE SAME

CROSS-REFERENCE TO RELATED APPLICATION

This application claims priority from and the benefit of Korean Patent Application No. 10-2016-0034153, filed on Mar. 22, 2016, which is hereby incorporated by reference for all purposes as if fully set forth herein.

BACKGROUND

Field

Exemplary embodiments relate to an electronic device. More particularly, exemplary embodiments relate to a flexible electronic device having improved durability and reliability.

Discussion of the Background

Various display devices, such as televisions, mobile phones, tablet computers, navigation devices, and game consoles used in multimedia devices are being developed. Display devices include a keyboard or a mouse as an input device. Also, in recent years, display devices have been developed that include a touch panel as an input device.

Unlike flat display devices according to the related art, various other types of display devices are being developed. Various flexible display devices, such as a curved display device, a bending type display device, a foldable display device, a rollable display device, and a stretchable display device are being developed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible electronic device having improved durability and reliability.

Additional aspects will be set forth in the detailed description which follows, and, in part, will be apparent from the disclosure, or may be learned by practice of the inventive concept.

An exemplary embodiment of the inventive concept discloses a flexible display device including a substrate and a line layer disposed on the substrate. The line layer includes: a first conductive layer disposed on the substrate; a plurality of polymer walls disposed on the first conductive layer and spaced apart from each other in a horizontal direction parallel to the substrate; and a second conductive layer including first portions disposed between the plurality of polymer walls and a second portion disposed on the plurality of polymer walls. A portion of the first conductive layer contacts the first portions.

In an exemplary embodiment, each of the plurality of polymer walls may have a curved shape to surround a virtual line perpendicular to the substrate.

In an exemplary embodiment, each of first and second polymer walls of the polymer walls may have a half-circular shape, and the first and second polymer walls may be spaced a predetermined distance from each other in the horizontal direction to extend.

In an exemplary embodiment, each of the polymer walls may have a random two-dimensional shape.

In an exemplary embodiment, the first portion may be filled between the polymer walls and overlap the plurality of polymer walls in the horizontal direction.

In an exemplary embodiment, each of the first portions may have the same thickness as each of the polymer walls, and the second portion disposed on the first portions has the same thickness as the second portion disposed on the polymer walls.

In an exemplary embodiment, the second conductive layer may be flat top surface.

In an exemplary embodiment, each of the polymer walls may have a thickness in a range of about 1 nm to about 10 nm.

In an exemplary embodiment, the polymer walls may be separated from each other by a distance in a range of about 10 nm to about 100 nm in the horizontal direction.

In an exemplary embodiment, each of the first portions may have a thickness in a range of about 10 nm to about 100 nm in the horizontal direction, and the first portions may be separated from each other by a distance in a range of about 10 nm to about 100 nm in the horizontal direction.

In an exemplary embodiment, each of the first portions may have a side surface that contacts a side surface of each of the polymer walls.

An exemplary embodiment of the inventive concept also discloses a method for manufacturing a flexible electronic device including: forming a first conductive layer on a substrate; forming a copolymer layer comprising a first polymer and a second polymer on the first conductive layer; phase-separating the first and second polymers of the copolymer layer so that the first and second polymers are alternately arranged in a horizontal direction parallel to the substrate; selectively removing the second polymer to form a plurality of polymer walls made of the first polymer and overlapping each other in the horizontal direction; and forming a second conductive layer on the polymer walls and the first conductive layer.

In an exemplary embodiment, the method may further include patterning the first conductive layer, the polymer walls, and the second conductive layer to form a line layer.

In an exemplary embodiment, the phase-separating of the first and second polymers may include heat-annealing the copolymer layer or solvent-annealing the copolymer layer.

In an exemplary embodiment, the removing of the second polymer may include selectively etching the second polymer.

In an exemplary embodiment, the forming of the second conductive layer may include depositing the second conductive layer after removing the second polymer.

In an exemplary embodiment, a portion of the second conductive layer, which is filled between the polymer walls, contacts the top surface of the first conductive layer.

In an exemplary embodiment, each of the first and second polymer walls of the polymer walls may have a half-circular shape, and the first and second polymer walls may be spaced apart from each other by a predetermined distance in the horizontal direction.

In an exemplary embodiment, each of the first and second polymers may have a random two-dimensional shape when viewed on a plane.

In an exemplary embodiment, the polymer walls may spaced apart from each other by a distance in a range of about 10 nm to about 100 nm in the horizontal direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept and, together with the description, serve to explain principles of the inventive concept.

DETAILED DESCRIPTION OF THE ILLUSTRATED EMBODIMENTS

Figure 1:
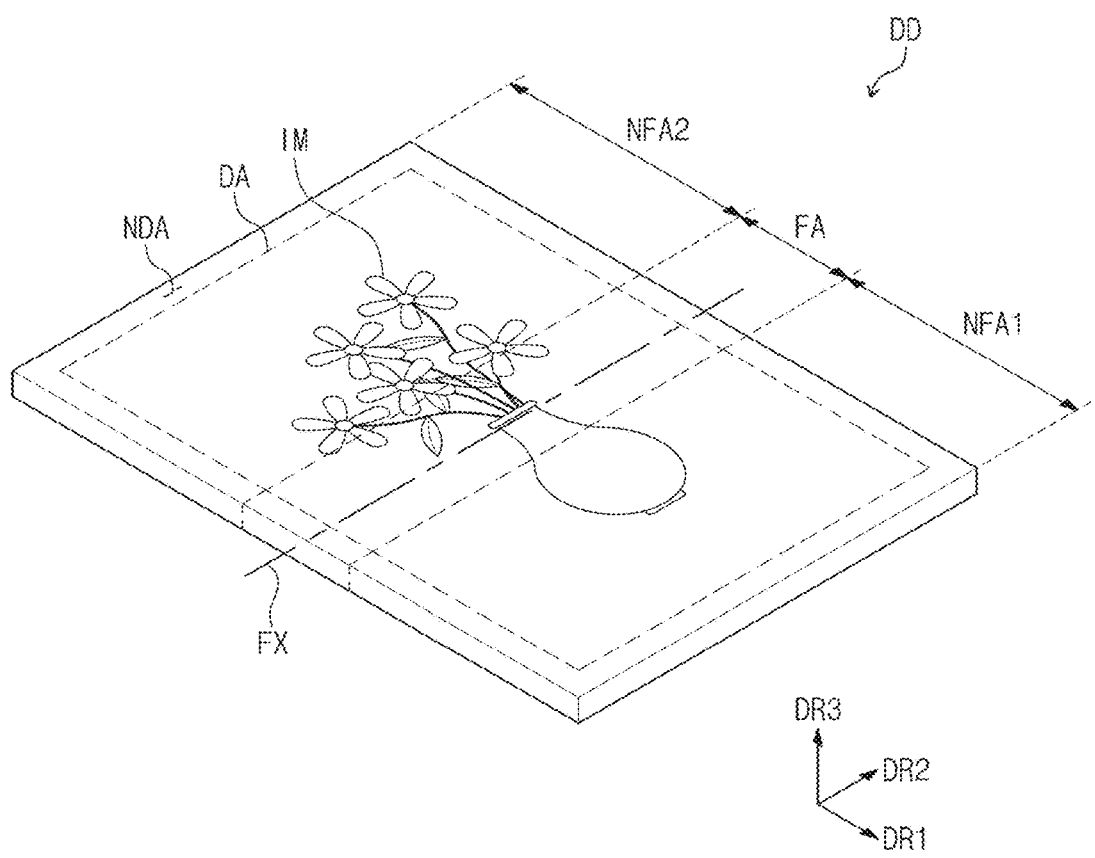
FIG. 1 is a perspective view of a flexible display device according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view of a flexible display device according to an exemplary embodiment of the inventive concept.

According to the exemplary embodiment, a foldable display device is illustrated as an example of the flexible display device DD. However, the inventive concept is not limited thereto and may be applied to various display devices DD, such as a curved display device, a bending type display device, a rollable display device, and a stretchable display device. Although not separately illustrated, the display device DD according to an exemplary embodiment of the inventive concept may be used in large scale electronic devices, such as a television and an outdoor advertising board, and also in small-to-medium scale electronic devices, such as a mobile phone, a personal computer, a laptop computer, a personal digital terminal, a vehicle navigation unit, a game console, a wrist watch type electronic device, and a camera.

As illustrated in FIG. 1, a display surface on which an image IM is displayed is parallel to a first direction DR1 and a second direction DR2. A normal direction of the display surface is parallel to a third direction DR3. The third direction DR3 may indicate a thickness direction of the flexible display device DD. A horizontal direction may represent a direction parallel to a plane that is perpendicular to the third direction DR3. Each of the members may have front and rear surfaces distinguished in the third direction DR3.

As illustrated in FIG. 1, the display device DD includes a plurality of areas distinguished on the display surface. The display device DD may be divided into a display area DA (also referred to as an "active area") and a non-display area NDA (also referred to as a "non-active area"). The display device DD displays an image through the display area DA. The non-display area NDA does not display an image. In the non-display area NDA, a driving unit and/or lines may be disposed to drive the display area DA. In FIG. 1, a flower base is illustrated as an example of the image IM. The non-display area NDA may surround the display area DA.

The display device DD may be divided into a folding area FA that may be curved as a result of an applied external force, and first and second non-folding areas NFA1 and NFA2, which are not curved as a result of an applied external force. The folding area FA may be disposed between the first and second non-folding areas NFA1 and NFA2. For example, the folding area FA may be curved with respect to a folding axis FX parallel to the second direction DR2.

Figure 2A:
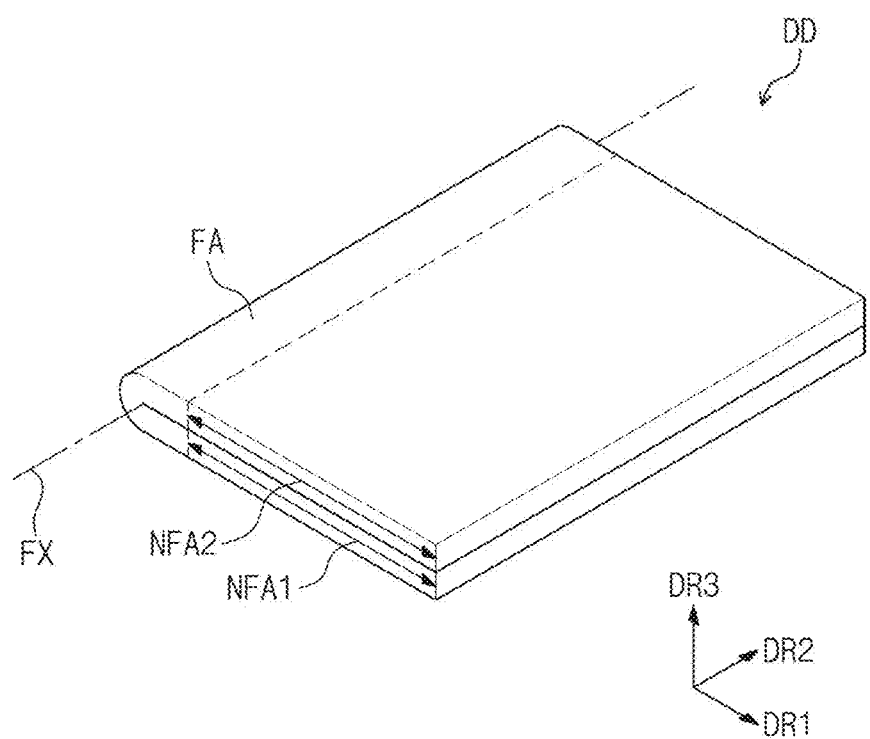
FIG. 2A is a perspective view of a display device according to an exemplary embodiment of the inventive concept.
Figure 2B:
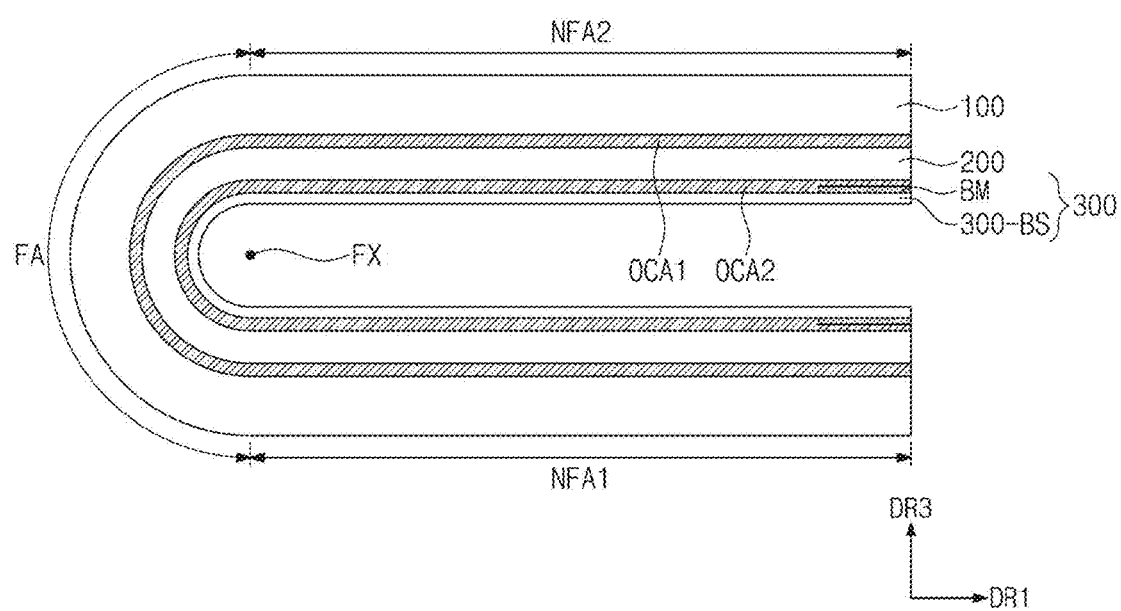
FIG. 2B is a cross-sectional view of a display device according to an exemplary embodiment of the inventive concept.

FIG. 2A is a perspective view of a display device according to an exemplary embodiment of the inventive concept, and FIG. 2B is a cross-sectional view of a display device according to an exemplary embodiment of the inventive concept.

As illustrated in FIG. 2A, a display device DD may be folded along a folding axis FX so that a display surface of a first non-folding area NFA1 faces a display surface of a second non-folding area NFA2. Hereinafter, a case in which the display device DD is folded so that the display surface of the first non-folding area NFA1 faces the display surface of the second non-folding area NFA2 is defined as "inner folding". In the exemplary embodiment, the first non-folding area NFA1 rotates in a clockwise direction with respect to the folding axis FX, and thus, the display device DD may be inner folded.

Although not shown, the display device DD may be folded along the folding axis FX so that the display surface of the first non-folding area NFA1 and the display surface of the second non-folding area NFA2 face the outside and are, therefore, exposed to the outside. Hereinafter, a case in which the display device DD is folded so that the display surfaces of the first non-folding areas NFA1 and NF2 face the outside and are exposed to the outside is defined as "outer folding".

Further referring to FIG. 2B, the display device DD includes a display panel 100, a touch panel 200, and a window member 300. Although not shown, the display device DD may be attached to a front surface of the window member 300 and further include a protection member configured to protect the display panel 100 and the touch panel 200. Each of the display panel 100, the touch panel 200, and the window member 300 may be flexible.

The display panel 100 generates the image IM (see FIG. 1) corresponding to inputted image data. The display panel 100 may be a liquid display panel, an organic light emitting display panel, an electrophoretic display panel, or an electrowetting display panel. However, the inventive concept is not limited to any particular kind of display panel 100. In an exemplary embodiment of the inventive concept, the organic light emitting display panel is described as an example.

The touch panel 200 obtains coordinate information of an input point. The touch panel 200 may be disposed on a front surface of the display panel 100. The touch panel 200 may be disposed between the window member 300 and the display panel 100. However, a positional relationship of the display panel 100 and the touch panel 200 is not limited thereto. The touch panel 200 may be a contact type or a non-contact type touch panel.

The window member 300 includes a base member 300-BS and a black matrix BM. The black matrix BM is disposed between the base member 300-BS and the touch panel 200 and may define a bezel area of the display device DD, i.e., the non-display area (see FIG. 1). The black matrix BM is an organic layer having color and, for example, may be formed by a coating method.

The base member 300-BS may include a glass substrate, a sapphire substrate, a plastic film, and the like. Although not separately shown, the window member 300 may further include a functional coating layer disposed on a front surface of the base member 300-BS. The functional coating layer may include an anti-fingerprint layer, an anti-reflective layer, and a hard coating layer.

The display panel 100 and the touch panel 200 may be coupled to each other through an optically clear adhesive film OCA1. The touch panel 200 and the window member 300 may be also coupled to each other through an optically clear adhesive film OCA2. In the exemplary embodiment of the inventive concept, one of two optically clear adhesive films OCA1 and OCA2 may be omitted. For example, the display panel 100 and the display touch panel 200 are fabricated by consecutive deposition processes, and thus the touch panel 200 may be disposed directly on the display panel 100.

Figure 3:
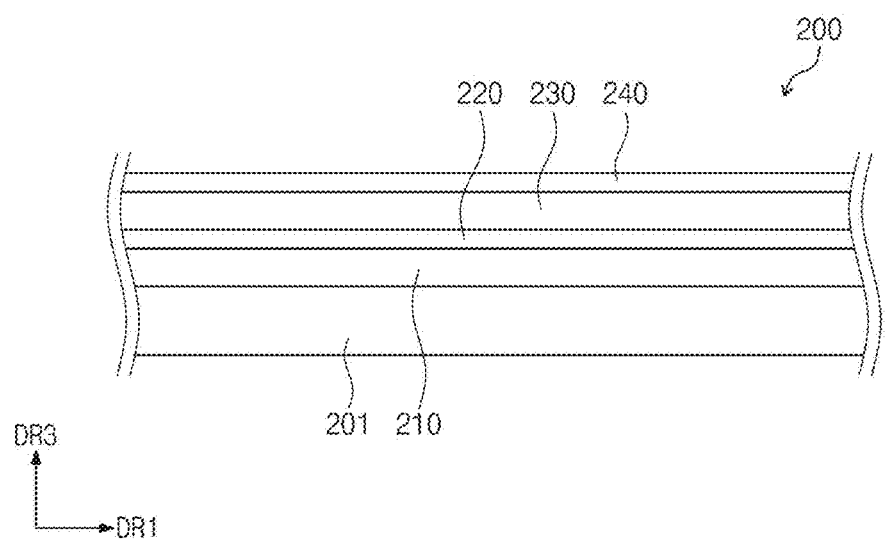
FIG. 3 is a cross-sectional view of a touch panel according to an exemplary embodiment of the inventive concept.
Figure 4:
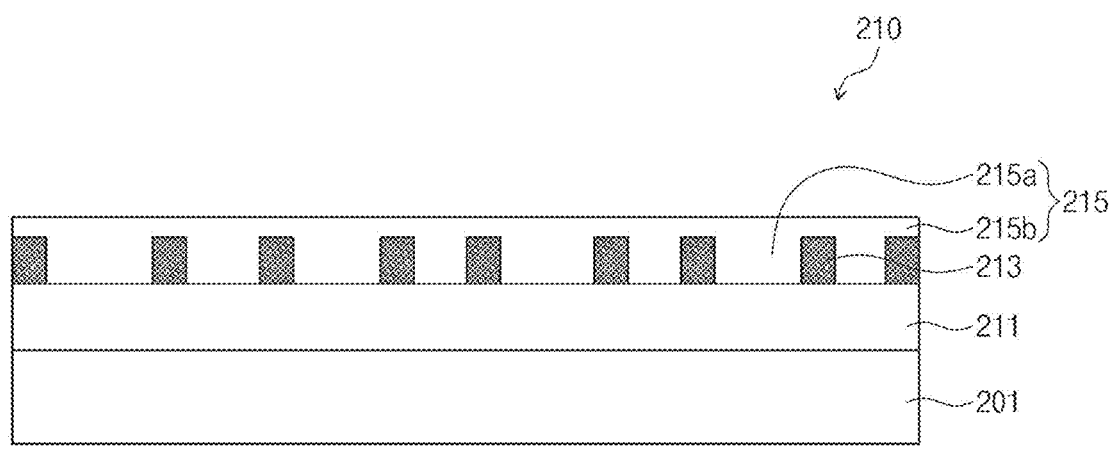
FIG. 4 is an enlarged cross-sectional view of a first line layer illustrated in FIG. 3.
Figure 5:
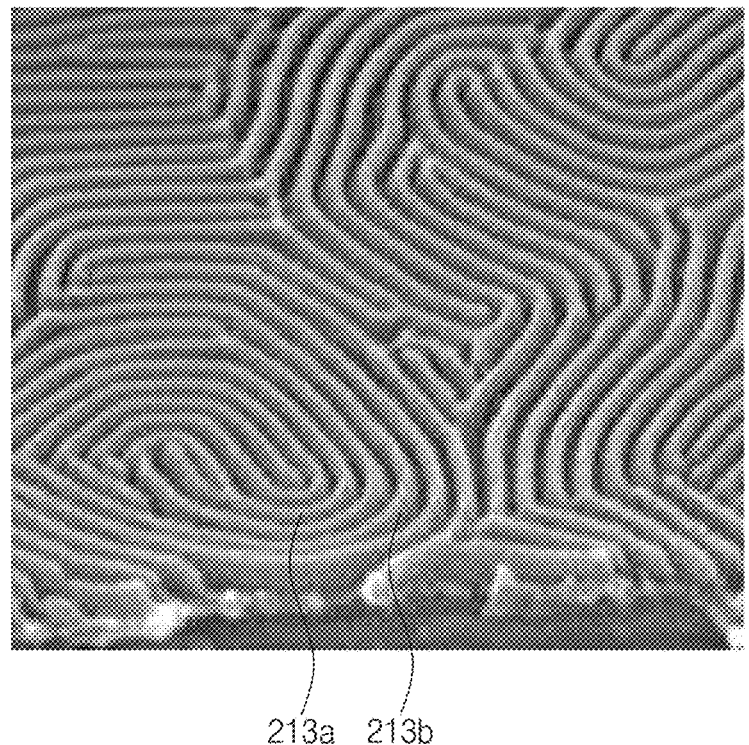
FIG. 5 is a SEM image of a polymer wall illustrated in FIG. 4.

FIG. 3 is a cross-sectional view of a touch panel according to an exemplary embodiment of the inventive concept, FIG. 4 is an enlarged view of a first line layer illustrated in FIG. 3, and FIG. 5 is an SEM image of a polymer wall illustrated in FIG. 4.

First, referring to FIG. 3, a touch panel 200 includes a substrate 201, a first line layer 210, a first insulation film 220, a second line layer 230, and a second insulation film 240. In the current exemplary embodiment, the first line layer 210, the first insulation film 220, the second line layer 230, and the second insulation film may be sequentially laminated on the substrate 201.

In FIG. 3, the touch panel 200 is a touch panel having a 2-layer structure, and each of the first and second line layers 210 and 230 are insulated from each other and may form one layer. In an exemplary embodiment, the touch panel 200 may be a touch panel having a 1-layer structure, the second line layer 230 may be omitted, and the first line layer 210 may form one layer. Hereinafter, the exemplary embodiment of the inventive concept in which the touch panel 200 has the 2-layer structure will be described.

In the current exemplary embodiment, the touch panel 200 may be a capacitive type touch panel. It is sufficient if the touch panel 200 includes two sensors crossing each other, however, the inventive concept is not limited to any particular kind of touch panel 200. The capacitive type touch panel may obtain coordinate information about a point touched by a self capacitance method or a mutual capacitance method.

The first line layer 210 may include a plurality of lines disposed on a top surface of the substrate 201. The lines may be touch sensor lines or connecting lines described later.

The first insulation film 220 may protect the lines or insulate portions of the lines from other portions of the lines. The first insulation film 220 may include a non-organic film or an organic film. The first insulation film 220 may have a multilayer structure and include at least one non-organic film and at least one organic film.

The second line layer 230 may include a plurality of lines. The lines may be touch sensor lines or connecting lines that will be described later.

The second insulation film 240 may protect the second line layer 230. The second insulation film 240 may a non-organic film or an organic film. The second insulation film 240 may have a multilayer structure and include at least one non-organic film and at least one organic film. In an exemplary embodiment, the second insulation film 240 may be omitted.

As illustrated in FIG. 4, in an exemplary embodiment, a first line layer 210 may include a first conductive layer 211, a plurality of polymer walls 213, and a second conductive layer 215.

The first conductive layer 211 may be disposed on a substrate 201. In an exemplary embodiment, the first conductive layer 211 may include a transparent conductive oxide, for example, an indium tin oxide (ITO), an indium zinc oxide (IZO), a zinc oxide (ZnO), and an indium tin zinc oxide (ITZO). In an exemplary embodiment of the inventive concept, the first conductive layer 211 may be an optically thin single-film or a multi-film including a metal such as molybdenum, silver, titanium, copper, aluminum, and an alloy thereof. Also, in an exemplary embodiment of the inventive concept, the first conductive layer 211 may include at least one of a conductive polymer, a metal nano-wire, or graphene. The first conductive layer 211 may include a first layer including one of the above-described materials, a second layer including another material, and other several layers.

The polymer walls 213 may be disposed on the first conductive layer 211. For example, the polymer walls 213 may be formed of, or include, polymers, such as polymethyl methacrylate (PMMA) and polystyrene (PS).

In an exemplary embodiment, the polymer walls 213 may have a nano-scale shape. More particularly, each of the polymer walls 213 may have a thickness (or height) of, for example, about 1 nm to about 10 nm, and the polymer walls 213 may be spaced apart from each other at distances of, for example, about 10 nm to about 100 nm in a horizontal direction. Also, each of the polymer walls 213 may have a thickness or width of about 10 nm to about 100 nm.

FIG. 5 is a scanning electron microscope (SEM) image of a plurality of polymer walls 213. As illustrated in FIG. 5, the polymer walls 213 may have a random shape when viewed on a plane. The polymer walls 213 may be spaced a predetermined distance from each other in the horizontal direction and interlaced with each other to form a two-dimensional pattern, for example, a pattern such as human fingerprints. The polymer walls 213 may overlap each other in the horizontal direction, but may not overlap in the third direction DR3.

The polymers 213 may have curved shapes. More particularly, at least a portion of each of the polymer walls 213 may have a curved shape to surround a virtual line (not shown) perpendicular to the substrate 201. Each of at least two polymer walls of the polymer walls, for example, each of the first and second polymer walls 213a and 213b, may have a half-circular shape. The first and second polymer walls 213a and 213b may be spaced a predetermined distance from each other.

The polymer walls 213, for example, may be formed through a nano-pattern formation method that uses self-assembly characteristics of a copolymer (or a block copolymer) described later.

Referring to FIG. 4 again, the second conductive layer 215 may be disposed on the first conductive layer 211 and the polymer walls 213. The second conductive layer 215 may include a transparent conductive oxide, for example, an indium tin oxide (ITO), an indium zinc oxide (IZO), a zinc oxide (ZnO), and an indium tin zinc oxide (ITZO). The second conductive layer 215 may be an optically thin single-film or multi-film including a metal such as molybdenum, silver, titanium, copper, aluminum, and an alloy thereof. Also, the second conductive layer 215 may include at least one of a conductive polymer, a metal nanowire, or graphene. The second conductive layer 215 may include a first layer including one of the above-described materials, a second layer including another material, and other several layers.

In an example, the second conductive layer 215 may be formed of a material the same as or different from the first conductive layer 211. According to a combination of the first and second conductive layers 211 and 215, durability and reliability with respect to a bending of the first line layer 210, and electrical conductivity or transmittance may be determined.

The second conductive layer 215 may include first portions 215a and a second portion 215b. The first and second portions 215a and 215b are divided for convenience in description, and the first and second portions 215a and 215b may be formed as a one-body or formed by the same process as each other.

In an example, each of the first portions 215a may be provided between the polymer walls 213 and filled into a space defined between the polymer walls 213. More particularly, the first portions 215a may overlap the polymer walls 213 in the horizontal direction, but may not overlap in the vertical direction. The first portions 215a may contact the top surface of the first conductive layer 211, which is not covered by the plurality of polymer walls 213. Each of the first portions 215a may have a side surface that contacts a side surface of each of the polymer walls 213.

Since the first portions 215a are filled into spaces between the polymer walls 213, the first portions 215a have shapes corresponding to the polymer walls 213. That is, the first portions 215a may have a random shape when viewed on a plane. The first portions 215a may be spaced a predetermined distance from each other in the horizontal direction and interlaced with each other to form a two-dimensional pattern, for example, a pattern such as human fingerprints. In an example, each of the first portions 215a may have a width of about 10 nm to about 100 nm in the horizontal direction, and the first portions 215a may be spaced apart from each other by a distance of about 10 nm to about 100 nm in the horizontal direction. Each of the first portions 215a may have a thickness (or a width) substantially equal to that of each of the polymer walls, for example, ranging from 1 nm to 10 nm.

The second portion 215b may be disposed on the first portions 215a and the polymer walls 213 to entirely cover the first portions 215a and the polymer walls 213.

The second portion 215b may have a constant thickness. More particularly, the second portion 215b disposed on the first portion 215a may have the same thickness as the second portion 215b disposed on the polymer walls 213. Thus, the top surface of the second portion 215b, i.e., the top surface of the second conductive layer 215, may be substantially flat. The inventive concept is not limited thereto, however. For example, the second portion 215b may have a stepped portion.

In an example, since the second line layer 230 also may have the same structure as the first line layer 210, i.e., the second line layer 230 may include the first conductive layer 211, the polymer walls 213, and the second conductive layer 215, duplicate descriptions will be omitted.

Figure 6:
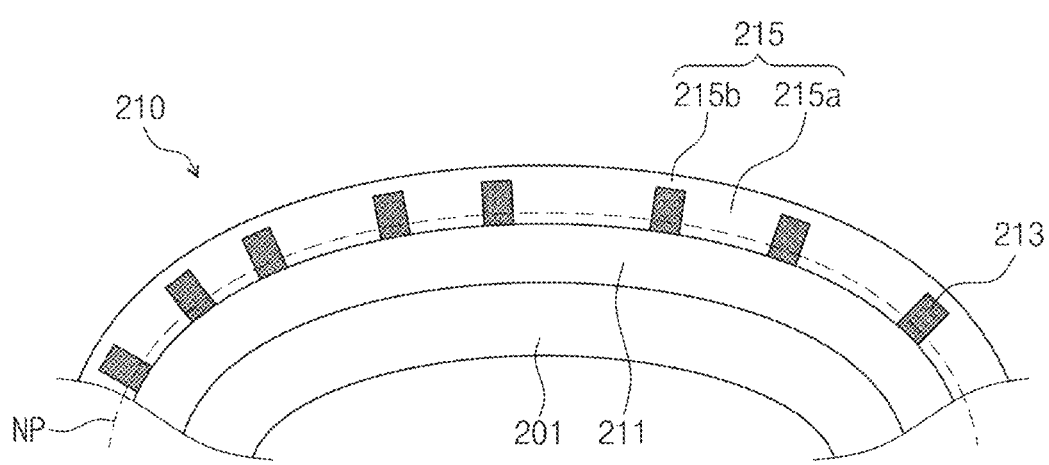
FIG. 6 is a cross-sectional view of a state in which the first line layer illustrated in FIG. 4 is curved.

FIG. 6 is a cross-sectional view of a state in which the first line layer illustrated in FIG. 4 is curved.

Referring to FIG. 6, the first line layer 210 may be outer-folded. Accordingly, with respect to a neutral plane NP defined in the first line layer 210, tensile force applied in the horizontal direction may be generated in upper constituents of the neutral plane NP, and compression force applied in the horizontal direction may be generated in lower constituents of the neutral plane NP. Thus, fractures may occur in the first and second conductive layers 211 and 215 due to the tensile force and the compression force. Since each of the polymer walls 213 may have a modulus less than those of the first and second conductive layers 211 and 215, the tensile force and the compression force applied on the first and second conductive layers 211 and 215 may be relieved. For example, each of the polymer walls 213 may have a modulus of about 10 Gpa or less, and the first and second conductive layers 211 and 215 may have a modulus of about 10 Gpa or more.

Because the polymer walls 213 have a random two-dimensional pattern to effectively relieve the compression force and the tensile force, thereby preventing nano-scale fractures from growing into micro-scale fractures. Generally, the micro-scale fractures may be easily propagated and cause a line to be opened to significantly reduce electrical conductivity of the line.

As a result, fractures (particularly, micro-scale fractures), which are generated in the first line layer 210 by the compression force and the tensile force generated when the first line layer 210 is folded, may be prevented, and also durability and reliability of the first line layer 210 with respect to the bending may be improved.

Figure 7:
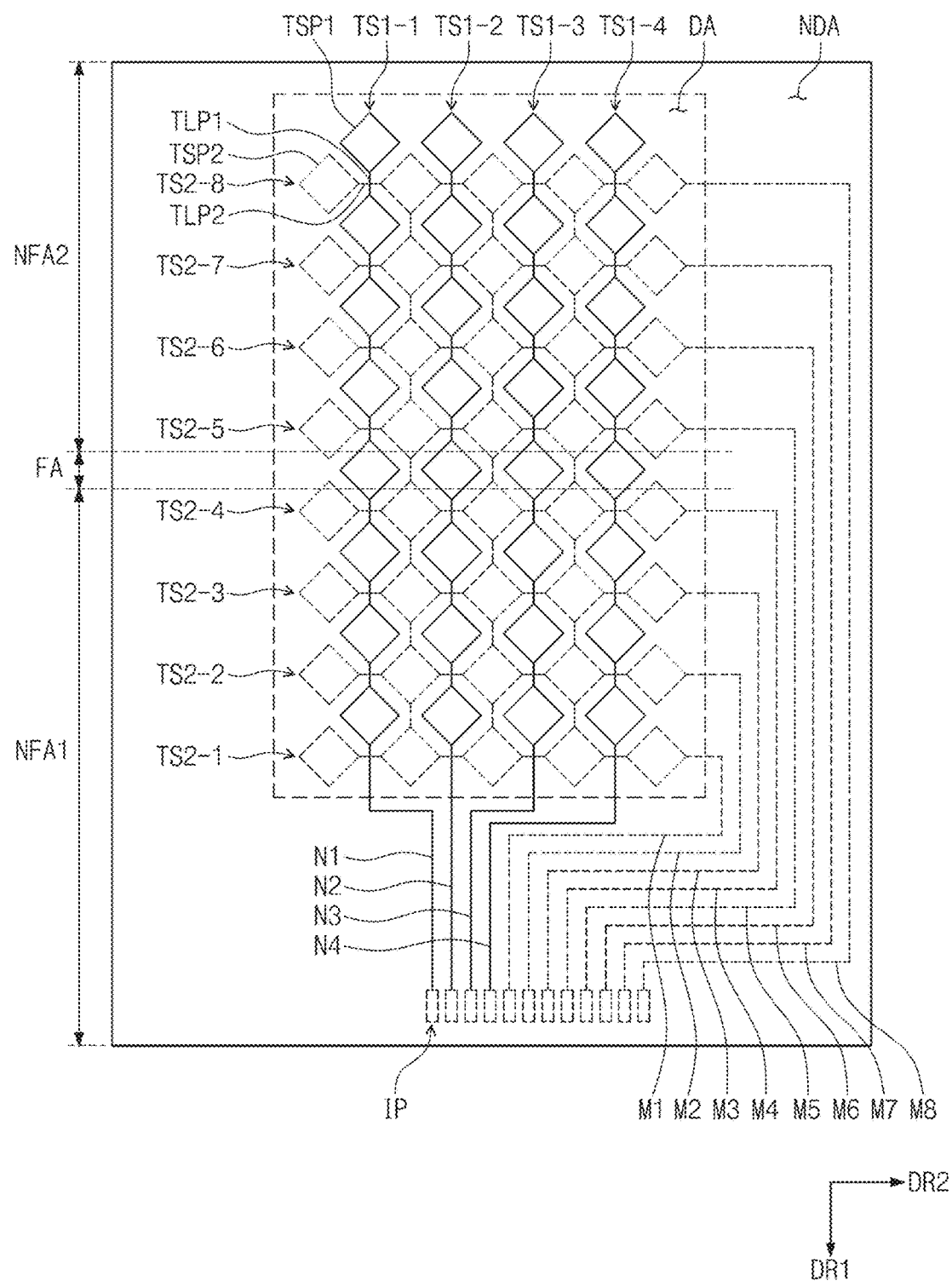
FIG. 7 is a plan view of the display panel illustrated in FIG. 3.

FIG. 7 is a plan view of the display panel illustrated in FIG. 3.

Referring to FIGS. 3 and 7, the touch panel 200 may include first touch sensor lines TS1-1 to TS1-4 disposed in the first line layer 210 and second touch sensor lines TS2-1 to TS2-8 disposed in the second line layer 230.

The first touch sensor lines TS1-1 to TS1-4 may extend in a first direction DR1 and be arranged in a second direction DR2. The second touch sensor lines TS2-1 to TS2-8 may extend in the second direction DR2 and be arranged in the first direction DR1. The second touch sensor lines TS2-1 to TS2-8 may be insulated from the first touch sensor lines TS1-1 to TS1-4.

In FIG. 7, four first touch sensor lines TS1-1 to TS1-4 and eight second touch sensor lines TS2-1 to TS2-8 are illustrated as an example. The first touch sensor lines TS1-1 to TS1-4 and the second touch sensor lines TS2-1 to TS2-8 are disposed in a display area DA.

The first touch sensor lines TS1-1 to TS1-4 include first sensor patterns TSP1 arranged in the first direction DR1 and first connecting patterns TLP1 configured to connect two first sensor patterns of the first sensor patterns TSP1, which are adjacent to each other in the first direction DR1. The first sensor patterns TSP1 and the first connecting patterns TLP1 may have a one-body shape. Also, although not shown, the first sensor patterns TSP1 and the first connecting patterns TLP1 may have a mesh shape.

The second touch sensor lines TS2-1 to TS2-8 include second sensor patterns TSP2 arranged in the second direction DR2 and second connecting patterns TLP2 configured to connect two second sensor patterns of the second sensor patterns TSP2, which are adjacent to each other in the second direction DR2. The second sensor patterns TSP2 and the second connecting patterns TLP2 may have a one-body shape. Also, although not shown, the second sensor patterns TSP2 and the second connecting patterns TLP2 may have a mesh shape. The second connecting patterns TLP2 are crossed and insulated from the corresponding first connecting patterns TLP1.

The touch panel 200 may include a plurality of connecting lines on the substrate 201 provided in a non-display area NDA. The connecting lines may be disposed in the first or second line layer 210 or 230.

The connecting lines include a plurality of first connecting lines N1 to N4 and a plurality of second connecting lines M1 to M8. Each of the first connecting lines N1 to N4 has one end connected to the corresponding first touch sensor of the first touch sensor lines TS1-1 to TS1-4 and the other end connected to the corresponding input pad of a plurality of input pads IP provided in a lower end-side of the non-display area NDA. The first connecting lines N1 to N4 may be connected to a touch drive unit (not shown) through the input pads IP. The first connecting lines N1 to N4 may receive a driving signal configured to drive the first touch sensor lines TS1-1 to TS1-4 from the touch drive unit or receive a touch signal provided from the first touch sensor lines TS1-1 to TS1-4 to the touch drive unit.

Also, each of the second connecting lines M1 to M8 has one end connected to each of the corresponding second touch sensor lines TS2-1 to TS2-8 and the other end connected to the corresponding input pad of the input pads IP. The second connecting lines M1 to M8 may receive a driving signal configured to drive the second touch sensor lines TSP2-1 to TSP2-8 from the touch drive unit or receive a touch signal provided from the second touch sensor lines TS2-1 to TS2-8 to the touch drive unit.

As previously described, the first and second touch sensor lines TS1-1 to TS1-4 and TS2-1 to TS2-8 and the connecting lines N1 to N4 and M1 to M8 may be disposed in the first and second line layers 210 and 230. Therefore, when the touch panel 200 is curved, the polymer walls 213 (see FIG. 4) in the first and second line layers 210 and 230 may effectively relieve the compression force and the tensile force generated in the first and second line layers 210 and 230. As a result, fractures may be prevented from being generated in the first and second line layers 210 and 230, and durability and reliability with respect to the bending of the touch panel 200 may be improved.

In an example, the exemplary embodiment in which the first and second line layer 210 and 230 are realized in the touch panel 200 is described, but the exemplary embodiment of the inventive concept is not limited thereto. The first or second line layer 210 or 230 may be realized as a line, such as a data line or a gate line of the display panel 100 (see FIG. 2B). Furthermore, the first or second line layer 210 or 230 may be applied to flexible small-to-medium or large scale electronic devices to improve the durability and reliability with respect to the bending of the flexible electronic devices.

FIGS. 8A to 8H are views of a method for manufacturing a first line layer according to an exemplary embodiment of the inventive concept.

Figure 8A:
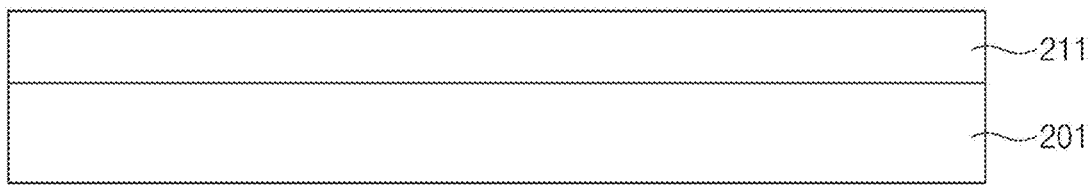
FIG. 8A, FIG. 8B, FIG. 8C, FIG. 8D, FIG. 8E, FIG. 8F, FIG. 8G, and FIG. 8H are views of a method for manufacturing a first line layer according to an exemplary embodiment of the inventive concept.

As illustrated in FIG. 8A, a first conductive layer 211 is formed on a substrate 201. The first conductive layer 211, for example, may be formed by using various methods, such as a vacuum deposition method, a spin coating method, a casting method, a Langmuir-Blodgett (LB) method, an inkjet printing method, a laser printing method, and a laser induced thermal imaging (LITI) method.

Figure 8B:
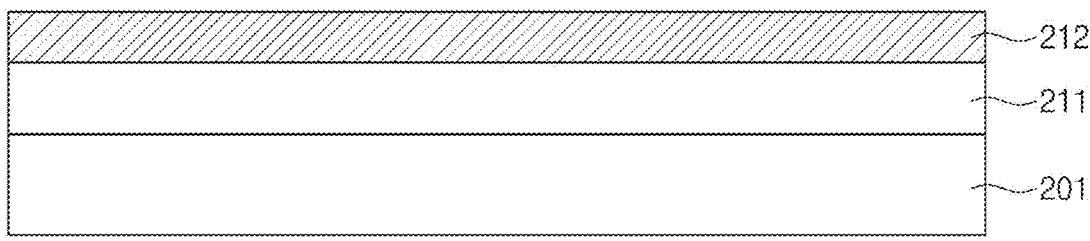

As illustrated in FIG. 8B, a copolymer layer 212 made of a first and a second polymer is formed on the first conductive layer 211. In an exemplary embodiment, the copolymer layer 212 may include a block copolymer including a first and a second polymer.

The block copolymer is a functional polymer having a shape in which two or more polymer blocks having structures different from each other are covalently bonded to each other to form one polymer. Each of the copolymer blocks constituting the block copolymer may have mixing characteristics and selective solubility, which are different from each other due to the difference of chemical structure. This may act as a factor through which the block copolymer is phase-separated or selectively dissolved in a solution phase or a solid phase to form a self-assembled structure.

The block copolymer, for example, may be polystyrene-polymethylmethacrylate (PS-PMMA). The exemplary embodiment of the inventive concept is not limited thereto. For example, the block copolymer may be a polybutadiene-polybutylmethacrylate copolymer, a polybutadiene-polydimethylsiloxane copolymer, a polybutadiene-polymethylmethacrylate copolymer, a polybutadienepolyvinylpyridine copolymer, a polybutylacrylate-polymethylmethacrylate copolymer, a polybutylacrylate-polyvinylpyridine copolymer, a polyisoprenepolyvinylpyridine copolymer, a polyisoprene-polymethylmethacrylate copolymer, a polyhexylacrylatepolyvinylpyridine copolymer, a polyisobutylene-polybutylmethacrylate copolymer, a polyisobutylene-polymethylmethacrylate copolymer, a polyisobutylene-polybutylmethacrylate copolymer, a polyisobutylenepolydimethylsiloxane copolymer, a polybutylmethacrylatepolybutylacrylate copolymer, a polyethylethylene-polymethylmethacrylate copolymer, a polystyrene-polybutylmethacrylate copolymer, a polystyrene-polybutadiene copolymer, a polystyrene-polyisoprene copolymer, a polystyrenepolydimethylsiloxane copolymer, a polystyrene-polyvinylpyridine copolymer, a polyethylethylene-polyvinylpyridine copolymer, a polyethylene-polyvinylpyridine copolymer, a polyvinylpyridinepolymethylmethacrylate copolymer, a polyethyleneoxidepolyisoprene copolymer, a polyethyleneoxide-polybutadiene copolymer, a polyethyleneoxide-polystyrene copolymer, a polyethyleneoxidepolymethylmethacrylate copolymer, a polyethyleneoxide-polydimethylsiloxane copolymer, a polystyrenepolyethyleneoxide copolymer.

Figure 8C:
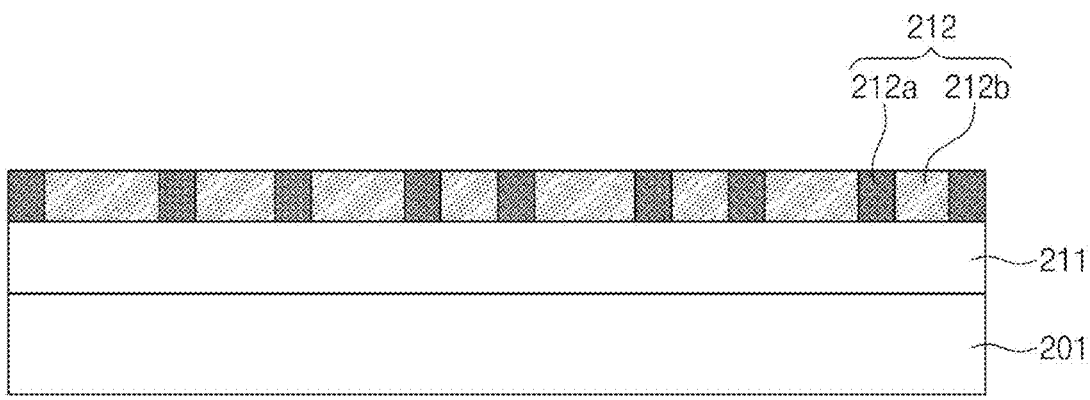
Figure 8D:
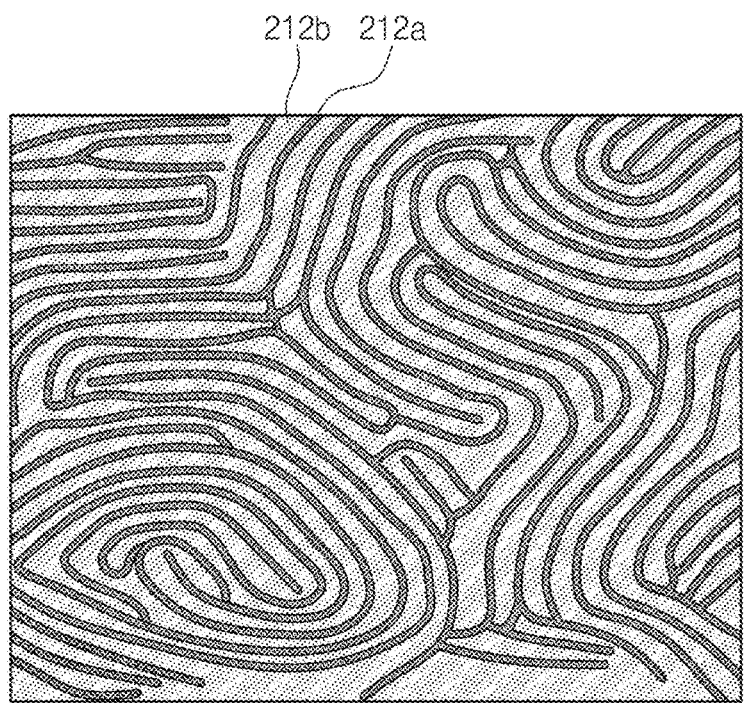

As illustrated in FIGS. 8C and 8D, first and second polymers 212a and 212b of the copolymer layer 212 are phase-separated to rearrange and orient the first and second copolymer 212a and 212b of the copolymer layer 212. In an exemplary embodiment, the copolymer 212 may be heat-annealed at a temperature greater than the glass transition temperature of the copolymer layer 212 to phase-separate the first and second polymers 212a and 212b. Also, the exemplary embodiment of the inventive concept is not limited thereto. For example, the copolymer layer 212 may be solvent-annealed to phase-separate the first and second polymers 212a and 212b.

Because the first and second polymers 212a and 212b of the copolymer layer 212 are separated in phase from each other, the first and second polymers 212a and 212b may be alternately arranged in the horizontal direction parallel to the substrate 201. The first and second polymers 212a and 212b may form the random two-dimensional shape previously described and a pattern, such as a fingerprint.

Figure 8E:
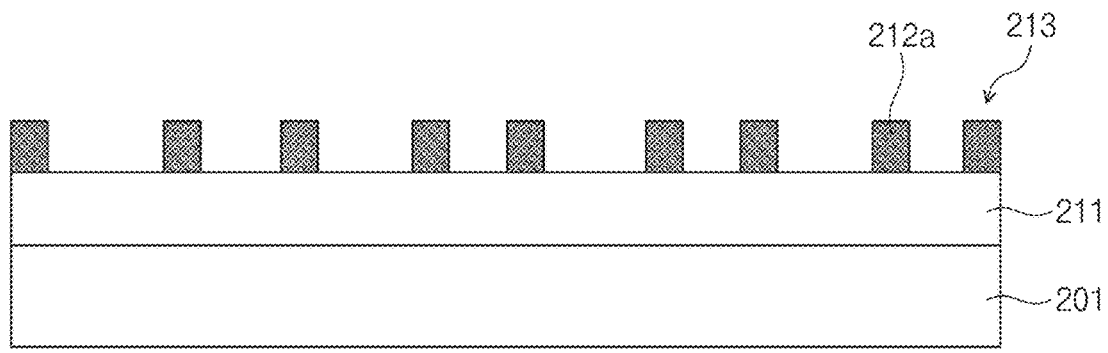
Figure 8F:
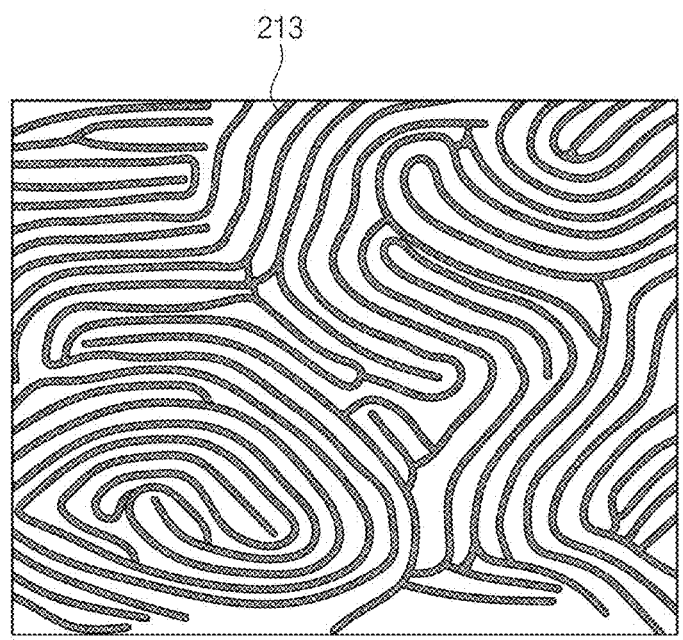

When the second polymers 212b selectively removed, only the first polymers 212a are left to form a plurality of polymer walls 213, as illustrated in FIGS. 8E and 8F. For example, a PMMA polymer constituting the second polymer 212b may be selectively etched and removed. When using a difference in solubilities of a PMMA polymer and a PS polymer, only the PMMA block may be selectively etched and removed by wet-etching, which uses a solvent.

Figure 8G:
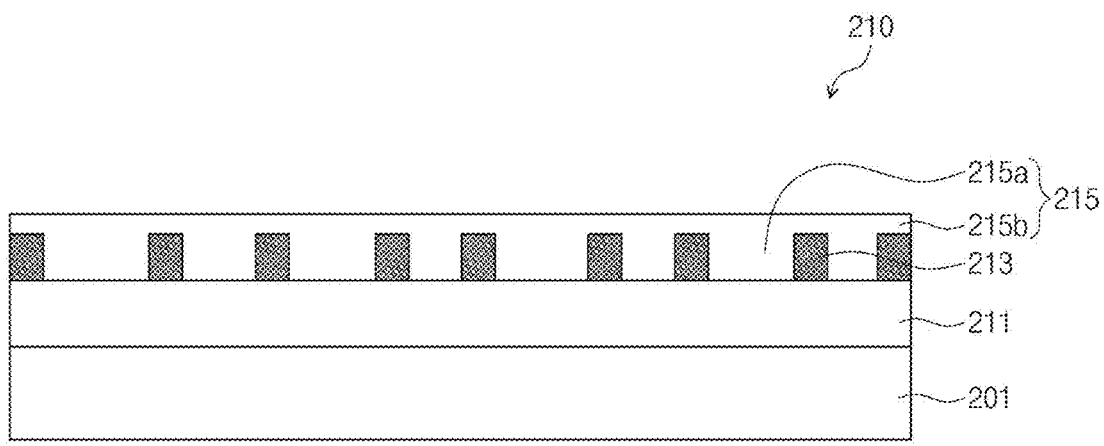

As illustrated in FIG. 8G, a second conductive layer 215 is formed on the polymer walls 213 and the first conductive layer 211. The second conductive layer 215, for example, may be formed by using various methods such as a vacuum deposition method, a spin coating method, a casting method, a Langmuir-Blodgett (LB) method, an inkjet printing method, a laser printing method, and a laser induced thermal imaging (LITI) method.

Figure 8H:
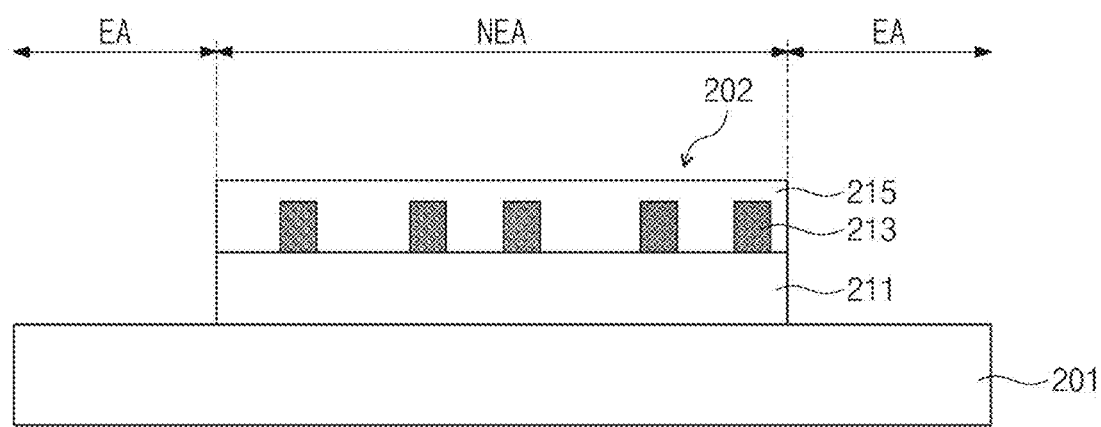

When the first conductive layer 211, the polymer walls 213, and the second conductive layer 215 are patterned, a line layer 202 corresponding to a predetermined layout as illustrated in FIG. 8H may be formed. For example, the first conductive layer 211, the polymer walls 213, and the second conductive layer 215 in an etching area EA may be etched, and the first conductive layer 211, the polymer walls 213, and the second conductive layer 215 in a non-etching area NEA may not be etched to form the line layer 202.

As described above, the polymer walls inside the line are included. Thus, the polymer walls relieve the stress generated in the first and second conductive layers when the line is curved. As a result, the fractures generated in the first and second conductive layers may be effectively prevented. Therefore, durability and reliability of the line may be improved.

Although certain exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:
1. A flexible electronic device comprising:
a substrate; and
a line layer disposed on the substrate,
wherein:
the line layer comprises:
a first conductive layer disposed on the substrate;
a plurality of polymer walls disposed on the first conductive layer and spaced apart from each other in a horizontal direction parallel to the substrate; and
a second conductive layer comprising first portions between the polymer walls and a second portion disposed on the polymer walls;
a portion of the first conductive layer contacts the first portions;
the plurality of polymer walls are disposed between the first conductive layer and the second conductive layer; and each of the polymer walls has a thickness in a range of about 1 nm to about 10 nm.

2. The flexible electronic device of claim 1, wherein each of the polymer walls has a curved shape in a plan view.

3. The flexible electronic device of claim 1, wherein each of first and second polymer walls of the polymer walls has a half-circular shape, and the first and second polymer walls are spaced a predetermined distance from each other in the horizontal direction.

4. A flexible electronic device comprising:
a substrate; and
a line layer disposed on the substrate,
wherein:
the line layer comprises:
a first conductive layer disposed on the substrate;
a plurality of polymer walls disposed on the first conductive layer and spaced apart from each other in a horizontal direction parallel to the substrate; and
a second conductive layer comprising first portions between the polymer walls and a second portion disposed on the polymer walls;
a portion of the first conductive layer contacts the first portions; and
each of the polymer walls has a random two-dimensional shape.

5. The flexible electronic device of claim 1, wherein each of the first portions is filled between the polymer walls and overlaps the polymer walls in the horizontal direction.

6. The flexible electronic device of claim 1, each of the first portions has the same thickness as each of the polymer walls, and the second portion disposed on the first portions has the same thickness as the second portion disposed on the polymer walls.

7. The flexible electronic device of claim 6, wherein the second conductive layer is flat top surface.

8. A flexible electronic device comprising:
a substrate; and
a line layer disposed on the substrate,
wherein:
the line layer comprises:
a first conductive layer disposed on the substrate;
a plurality of polymer walls disposed on the first conductive layer and spaced apart from each other in a horizontal direction parallel to the substrate; and
a second conductive layer comprising first portions between the polymer walls and a second portion disposed on the polymer walls;
a portion of the first conductive layer contacts the first portions;
the plurality of polymer walls are disposed between the first conductive layer and the second conductive layer; and the polymer walls are spaced apart from each other at a distance in a range of about 10 nm to about 100 nm in the horizontal direction.

9. The flexible electronic device of claim 1, wherein each of the first portions has a width in a range of about 10 nm to about 100 nm in the horizontal direction, and the first portions are spaced apart from each other at a distance in a range of about 10 nm to about 100 nm in the horizontal direction.

10. The flexible electronic device of claim 1, wherein each of the first portions comprises a side surface that contacts a side surface of each of the polymer walls.

11. A method for manufacturing a flexible electronic device, the method comprising:
forming a first conductive layer on a substrate;
forming a copolymer layer comprising a first polymer and a second polymer on the first conductive layer;
phase-separating the first and second polymers of the copolymer layer so that the first and second polymers are alternately arranged in a horizontal direction parallel to the substrate;
selectively removing the second polymer to form a plurality of polymer walls made of the first polymer and overlapping each other in the horizontal direction; and
forming a second conductive layer on the polymer walls and the first conductive layer,
wherein each of the first and second polymers has a random two-dimensional shape when viewed on a plane.

12. The method of claim 11, further comprising patterning the first conductive layer, the polymer walls, and the second conductive layer to form a line layer.

13. The method of claim 11, wherein the phase-separating of the first and second polymers comprises heat-annealing the copolymer layer or solvent-annealing the copolymer layer.

14. The method of claim 11, wherein the removing of the second polymer comprises selectively etching the second polymer.

15. The method of claim 11, wherein the forming of the second conductive layer comprises depositing the second conductive layer after removing the second polymer.

16. The method of claim 11, wherein a portion of the second conductive layer, which is filled between the polymer walls, contacts a top surface of the first conductive layer.

17. The method of claim 11, wherein each of first and second polymer walls of the polymer walls has a half-circular shape, and the first and second polymer walls are spaced a predetermined distance from each other in the horizontal direction.

18. The method of claim 11, wherein the polymer walls are spaced apart by a distance in a range of about 10 nm to about 100 nm in the horizontal direction.

* * * * *